US007985450B2

(12) United States Patent
Shin et al.

(10) Patent No.: US 7,985,450 B2
(45) Date of Patent: Jul. 26, 2011

(54) METHOD FOR THIN FILM VAPOR DEPOSITION OF A DIALKYL AMIDO DIHYDROALUMINUM COMPOUND

(75) Inventors: Hyun Koock Shin, Suwon (KR); Bum Soo Kim, Cheonan (KR); Jin Sik Kim, Suwon (KR); Jun Young Kim, Anyang (KR); Young Seop Kim, Icheon (KR); Bo Yearn Cho, Pyeongtaek (KR)

(73) Assignee: UP Chemical Co., Ltd., Gyeonggi-Do (KR)

( * ) Notice: Subject to any disclaimer, the term of this patent is extended or adjusted under 35 U.S.C. 154(b) by 1287 days.

(21) Appl. No.: 11/600,628

(22) Filed: Nov. 16, 2006

(65) Prior Publication Data
US 2010/0099257 A1   Apr. 22, 2010

(30) Foreign Application Priority Data
Nov. 16, 2005   (KR) .................. 10-2005-0109881

(51) Int. Cl.
*C23C 16/20* (2006.01)
(52) U.S. Cl. ........................................ 427/252
(58) Field of Classification Search ............... 427/248.1, 427/252
See application file for complete search history.

(56) References Cited

U.S. PATENT DOCUMENTS

| 3,320,296 A | 5/1967 | Fetter et al. | |
|---|---|---|---|
| 5,178,911 A | 1/1993 | Gordon et al. | |
| 5,191,099 A * | 3/1993 | Gladfelter et al. | 556/27 |
| 2002/0187644 A1 | 12/2002 | Baum et al. | |
| 2005/0003662 A1 | 1/2005 | Jursich et al. | |

FOREIGN PATENT DOCUMENTS

| EP | 0 987 270 A2 | 3/2000 |
|---|---|---|
| EP | 1 067 595 A2 | 1/2001 |
| IT | 684 730 | 3/1965 |

OTHER PUBLICATIONS

Coffman et al.; "Chemical Synthesis of Aluminum Nitride Powders"; Mat. Res. Soc. Symp. Proc. vol. 180; 1990; pp. 709-714.
Ruff et al.; "The Amine Complexes of Aluminum Hydride. I."; Journal of American Chemical Society (1960); 82, pp. 2141-2144.
Ruff et al.; "The Amine Complexes of Aluminum Hydride. II."; Journal of American Chemical Society (1961); 83, pp. 535-538.
Ruff et al.; "The Preparation and Reactions of Dialkylamino Derivatives of Aluminum"; Journal of American Chemical Society (1961); 83, pp. 2835-2839.
F. Peters; "Aluminum Hydride Derivatives From the Reactions of Lithium Aluminum Hydride With Trimethylamine and Dimethylamine"; Canadian Journal of Chemistry, vol. 42; (1904); pp. 1755-1758.

* cited by examiner

*Primary Examiner* — Timothy H Meeks
*Assistant Examiner* — Elizabeth Burkhart
(74) *Attorney, Agent, or Firm* — Frommer Lawrence & Haug LLP; Ronald R Santucci

(57) ABSTRACT

A method for the vapor deposition of aluminum films is provided. Such method employs a dialkyl amido dihydroaluminum compound of the formula $[H_2AlNR^1R^2]_n$, wherein $R^1$ and $R^2$ are the same or different alkyl groups having 1 to 3 carbons, and n is an integer of 2 or 3. The aluminum films may be thick or thin and may be aluminum films or may be mixed metal films with aluminum metal. Both CVD and ALD methods may be employed.

4 Claims, No Drawings

METHOD FOR THIN FILM VAPOR DEPOSITION OF A DIALKYL AMIDO DIHYDROALUMINUM COMPOUND

The present invention relates to the field of metalorganic compounds. In particular, the present invention relates to a method for thin film vapor deposition using certain aluminum compounds.

In the electronic industry the development of new technology and materials has resulted in miniaturization, high reliability, high speed, high performance, high degree of integration, etc., of devices such as semiconductor integrated circuits. With the development of device manufacturing technology, the development of memory devices (e.g., DRAM: Dynamic Random Access Memory) made rapid progress with increasing device performance, resulting in the mass production of mega-DRAMs and even giga-DRAMs. With advancement in new materials and technologies, it is expected that the development and mass production of tera-class memory devices will be achieved in the next generation of electronic devices.

With the development of new technologies, vapor deposition using aluminum as wiring material for example, revealed limitations in its applicability to manufacturing technologies for advanced electronic devices when the currently used vapor deposition of metal by sputtering to deposit a desired thin film with the metal itself was used alone.

Therefore, while current aluminum metal wiring process depends completely on the sputtering method that employs a desired aluminum metal target with an electron beam, it is inappropriate to use the sputtering method alone in a vapor deposition process because the next generation of electronic devices will have circuit line widths of 0.11 μm, 0.09 μm, etc., resulting in a high aspect ratio contact or via hole (depth/diameter).

To overcome this difficulty, aluminum wiring processes using atomic layer deposition ("ALD") and chemical vapor deposition ("CVD") have long been studied, since these offer advantages in the filling process of contact/via holes with high aspect ratios because of high step coverage. As a result of such studies, a basis has been established for the aluminum vapor deposition process that will be used for the manufacturing of the next generation of electronic devices using the aluminum CVD or ALD method, and applications of such methods are clearly in progress.

As described above, an aluminum compound, called a precursor, is used as the source material for vapor deposition of aluminum thin films based on ALD and CVD methods. Because the properties and the selection of a precursor compound are very important elements for the success of the ALD and CVD methods for the thin film vapor deposition based on the above aluminum compound, the selection of a precursor is absolutely one of the first items to be considered prior to the implementation of a deposition method.

Early studies on aluminum CVD ("Al-CVD") were carried out with alkyl aluminum compounds that were widely used commercially. Typical alkyl aluminum compounds included trimethyl aluminum ("TMA") represented by the chemical formula $Al(CH_3)_3$ and triisobutyl aluminum ("TIBA") represented by the chemical formula $[(CH_3)_2CHCH_2]_3Al$.

As TMA and TIBA have been commercialized for various applications in other industrial fields, they could easily be obtained at low prices in the market. While they have high and thermally stable vapor pressures and various other advantages such as being liquid at room temperature, their vapor deposition is problematic because their thin film vapor deposition occurs at high temperatures, i.e., around 300° C.-400° C. Vapor deposition at such high temperatures results in the introduction of unwanted carbon impurities, causing a critical drawback of increased electrical resistivity of the aluminum thin film. Therefore, their application is sometimes excluded from processes which require vapor deposition at low temperatures of 250° C. or less.

In the 1990s dimethyl aluminum hydride ("DMAH") became widely commercialized, primarily in Japan, as the precursor compound for chemical vapor deposition of aluminum thin films. This chemical with the chemical formula $[(CH_3)_2AlH]_2$ was disclosed in the Journal of American Chemical Society, vol 75, pg. 835, 1953.

In the case of the Al-CVD method using DMAH, the compound has a high vapor pressure (2 ton at 25° C.) making its vapor deposition rate high. While it is a colorless liquid at room temperature and has the advantage that aluminum thin films of high purity are deposited, DMAH has an explosive flammability upon exposure to air similar to trimethyl aluminum, making it difficult to handle. Because this compound presents significant difficulty for compound manufacturing, its yield is low and its cost is high, which makes it uneconomical. As vapor deposition is typically carried out at relatively high temperatures of 260° C.-300° C., DMAH, like the traditional compounds described above, it also has the disadvantage that a thin film may contain carbon impurities.

On the other hand, dimethyl ethyl amine alane ("DMEAA") represented by the chemical formula $H_3Al:N(CH_3)_2C_2H_5$ has been a typical precursor compound for Al-CVD. DEMAA was synthesized by Wayne Gladfelter of the University of Minnesota at Minneapolis, USA in 1989 as a precursor for CVD applications using alkyl amine complex compounds and aluminum trihydride ($AlH_3$) published in the well-known Journal of American Chemical Society by J. K. Ruff and M. F. Hawthorne in 1960, and selected as the complex compound of dimethyl ethyl amine ($N(CH_3)_2C_2H_5$). See U.S. Pat. No. 5,191,099 (Gladfelter).

Furthermore, the present inventors have obtained a patent (Korean Pat. No. KR 98-14522 and U.S. Pat. No. 6,399,772) for 1-methyl pyrrolidine alane ("MPA"), which has been used as a typical precursor for Al-CVD worldwide.

The compounds DMEAA and MPA undergo the reaction as in Reaction Equation 1 below, and it forms vapor deposition aluminum thin films of high purity at low temperatures of 100° C.-200° C. Their flammability is somewhat less than that of the existing DMAH, they have relatively high vapor pressures (DMEAA: 1.5 torr at 25° C.; MPA: 3.2 ton at 55° C.) and they are colorless liquid compounds at room temperature. In addition, they have the advantage of being cost-effective because they are prepared by a simple process.

  Reaction Equation 1

In the above equation, L represents a Lewis base and stands for dimethyl ethyl amine or methyl pyrrolidine.

However, because DMEAA is thermally unstable at room temperature, and MPA is thermally unstable if it is heated to 45° C. to carry out vapor deposition, they gradually decompose in a storage container for precursors, and produce aluminum hydride ($AlH_3$). When they are used for the manufacture of electronic devices, productivity suffers since reproducibility of the vapor deposition is limited, and they form particles, which constitute flaws that make continuous processing difficult.

Therefore, the present invention is intended to solve the above problems, and has as an objective to provide a method for thin film vapor deposition, wherein dialkyl amido dihydroaluminum, which is represented by Chemical Formula 1 $[H_2AlNR^1R^2]_n$ wherein $R^1$ and $R^2$ are the same or different alkyl groups having 1 to 3 carbons, and n is an integer of 2 or 3, is used as a precursor compound for ALD and CVD to form metal thin films thermally stable at room temperature or even when heated. Dialkyl amido dihydroaluminum does not decompose in a storage container and particles do not form. Although the vapor deposition process is carried out at relatively low temperatures, carbon impurities are not generated and this compound is somewhat stable upon exposure to air.

To achieve the above objective, the present invention provides a method for forming aluminum film by vapor deposition comprising: providing a substrate in a vapor deposition reactor; providing a compound of Chemical Formula 1 $[H_2AlNR^1R^2]_n$, wherein $R^1$ and $R^2$ are the same or different alkyl groups with 1 to 3 carbons, and n is an integer of 2 or 3, in a vapor phase to the reactor; and depositing an aluminum film on the substrate. In one embodiment, the vapor deposition reactor is chosen from a CVD reactor and an ALD reactor. In another embodiment, the compound of Chemical Formula 1 is dimethyl amido dihydroaluminum. Suitable substrates include silicon, glass, quartz, and TEFLON™ fluorinated polymer.

As may be found in Reaction Equation 2 below, dialkyl amido dihydroaluminum represented by Chemical Formula 1 that is used for the vapor deposition process of the present invention may simply be prepared by a method in which trihydroaluminum and a secondary amine of dialkyl amine are reacted to form an alane complex compound as an intermediate product and hydrogen gas is removed from said alane complex compound.

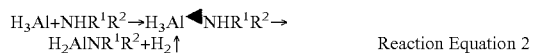

Reaction Equation 2

In the above Reaction Equation 2, $R^1$ and $R^2$ stand for the same or different alkyl groups having a carbon number of 1 to 3.

In another method, as in Reaction Equation 3 below, a hexane or pentane solvent is placed in a reaction container in which a halogenated metal salt of aluminum chloride powder and lithium aluminum hydride (LiAlH$_4$) powder have been mixed to prepare a suspension of mixed powder, and a secondary amine, such as diethyl amine, ethyl methyl amine, and dipropyl amine, is added to carry out a reaction so that the compound of Chemical Formula 1 may easily be prepared.

Reaction Equation 3

In the above Reaction Equation 3, $R^1$ and $R^2$ are the same or different alkyl groups having 1 to 3 carbons, and n is an integer of 2 or 3.

The compound thus prepared by Chemical Formula 1 provides the following improvements when it is used as a precursor for vapor deposition of an aluminum ("Al") thin films. First, these compounds can contribute greatly to the reduction of defects in electronic devices and maximize productivity by improving reproducibility of the manufacturing processes because the thin film vapor deposition process based on these compounds uses stable compounds with high vapor pressures, the compounds are not degraded by heating to vaporize under appropriate process conditions for atomic layer deposition and chemical vapor deposition of an aluminum thin film, and particles do not form due to precursor decomposition. Second, the thin film vapor deposition process that uses these compounds as precursors makes fast vapor deposition rates possible due to high vapor pressures of the precursors, resulting in improved economy from reduced production processes and time. Third, the formation of carbides is prevented and vapor deposition of a thin film of high purity can be achieved because these compounds undergo vapor deposition when their thin film vapor deposition process temperature is low at 120° C.-250° C.

In addition, it is preferred for the present invention that dimethyl amido dihydroaluminum represented by Chemical Formula 2 below with $R^1$ and $R^2$ being methyl groups, ethyl methyl amide dihydroaluminum represented by Chemical Formula 3 with $R^1$ and $R^3$ being different methyl, and diethyl amido dihydroaluminum represented by Chemical Formula 4 with $R^1$ and $R^2$ being ethyl groups, are used among compounds described by Chemical Formula 1 as precursors for vapor deposition of an aluminum thin film based on chemical vapor deposition.

Chemical Formula 2

Chemical Formula 3

Chemical Formula 4

In particular, ethyl methyl amido dihydroaluminum of Chemical Formula 3 and diethyl amido dihydroaluminum of Chemical Formula 4 are preferred and used more as precursors because these compounds exist as dimers at room temperature and their vapor deposition can be performed at lower temperatures than that of dimethyl amido dihydroaluminum of Chemical Formula 2, which exists as a trimer. Also, bubbling may be easier during vapor deposition process for these compounds because their melting points are low relative to the compound of Chemical Formula 2.

In addition, dipropyl amido dihydroaluminum compound represented by Chemical Formula 5 below, wherein $R^1$ and $R^2$ are propyl groups in the compound of Chemical Formula 1 above, is also preferred and used.

Chemical Formula 5

In addition, the dialkyl amido dihydroaluminum compounds described above have the advantage of selective vapor deposition wherein a thin film is deposited only on metals such as titanium nitride ("TiN"), tantalum nitride ("TaN"), titanium ("Ti"), and ruthenium ("Ru") but not on non-metals including SiO$_2$ and TEFLON™ fluorinated polymer.

As an example of the compounds of the present invention described above, a reaction mechanism is listed below when the ethyl methyl amido dihydroaluminum compound defined in the above Chemical Formula 3 is used as the precursor for chemical vapor deposition of an aluminum thin film.

Reaction Equation 4:

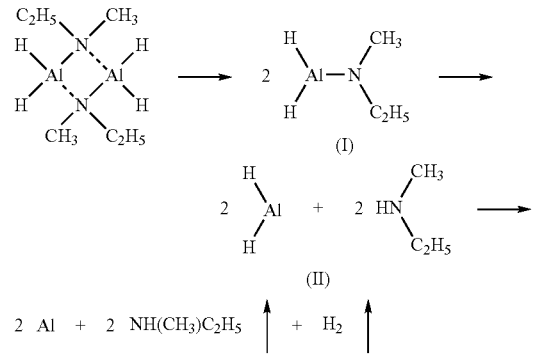

As shown in Reaction Equation 4 above, ethyl methyl amine and hydrogen (H$_2$) formed as final by-products are volatile by-products that are not decomposed at the temperature of thin film vapor deposition and can be easily removed from the silicon substrate for vapor deposition and from the aluminum thin film. This may be described in steps. The precursor compound of gaseous ethyl methyl amido dihydroaluminum is introduced into a reactor prior to Reaction Equation 4 above and then is adsorbed on the surface of the substrate in a gaseous state described by reaction (I). Then ethyl methyl amide is split off from the ethyl methyl amido dihydroaluminum adsorbed on said substrate, hydrogen is removed from the remaining dihydroaluminum ($AlH_2$), and two molecules of ethyl methyl amine and hydrogen are vaporized so that an aluminum thin film is deposited on the substrate.

At this time, as shown in Reaction Equation 4 above, the step in which ethyl methyl amide splits off from ethyl methyl amido hydroaluminum adsorbed on the surface of a substrate determines the rate and the feasibility of low temperature vapor deposition depending on how smoothly ethyl methyl amide dissociates into gaseous ethyl methyl amine.

While not wishing to be bound by theory, it is believed that the nitrogen in ethyl methyl amide, which formed a covalent bond with an aluminum metal as described in the above reaction equation, forms a dimer while retaining a non-covalent electron pair and provides an electron pair to a neighboring aluminum metal electron. The bonding length between the aluminum and the nitrogen becomes long and its bonding strength weakens at this time, requiring a lower dissociation energy compared to an alkyl aluminum compound formed between aluminum and carbon whose bonding strength is high. The refore, dissociation of ethyl methyl amide into gaseous ethyl methyl amine may take place smoothly. In other words, an aluminum thin film may be deposited with a high vapor deposition rate at relatively low temperatures of 120° C. to 250° C. using one of the compounds of the present invention, ethyl methyl amido dihydroaluminum while the vapor deposition temperature of an aluminum thin film ranges from 250° C. to 400° C. for the existing compounds of dimethyl aluminum hydride, triisobutyl aluminum, and trimethyl aluminum. The technology of depositing an aluminum thin film at low temperatures has great significance because interlayer diffusion may be prevented during metal vapor deposition of upper layers in the electronic device manufacturing process requiring multi-layer wiring based on metal vapor deposition.

Therefore, as in the reaction mechanism of Reaction Equation 4 above, ethyl methyl amine and hydrogen ($H_2$) gases are generated as by-products from the reaction pathway of ethyl methyl amido dihydroaluminum, the generated hydrogen gas is easily removed from the deposited thin film, and ethyl methyl amine does not decompose further in the vapor deposition temperature range and is removed as a gas. In this way vapor deposition of an aluminum thin film is achieved with high purity, without carbon or nitrogen impurities. Because the penetration of impurities into a thin film increases the resistivity of an aluminum metal wiring that requires low resistivity and reduces its signal transmission rate, vapor deposition of a thin film of high purity is very significant in vapor deposition of an aluminum thin film.

In addition, improved productivity may be expected from the method for vapor deposition of aluminum thin films based on the compounds of the present invention because it improves process reproducibility and defect rates which are shortcomings of the vapor deposition process due to particle formation based on dimethyl ethyl amine alane ("DMEAA") and 1-methyl pyrrolidine alane.

Furthermore, the present invention provides a more advantageous aluminum vapor deposition process based on the precursor solution for an aluminum thin film vapor deposition process when the above aluminum thin film vapor deposition process is applied to a liquid compound feeder such as a direct liquid injector or a liquid delivery system. Mostly polar solvents are used as the solvent of the precursor compound solution for aluminum thin film vapor deposition for use in a liquid compound feeder, and in particular, solvents such as 1-methyl pyrrolidine, 1-butyl pyrrolidine, 1-methyl piperidine, 1-ethyl piperidine, 4-methyl morpholine, 4-ethyl morpholine, and 1,4-dimethyl piperazine may be used. The compounds used in the present invention that are defined by Chemical Formula 1 above are used as a solute. Such solvents and solutes are used in a number of combinations, and these aluminum compound solutions may also be used for aluminum thin film vapor deposition processes as very effective precursors.

In addition, it is preferable to use one of the bubbling modes, vapor phase MFC (mass flow controller) or direct liquid injection (DLI), as a precursor delivery mode when the compound in Chemical Formula 1 above of the present invention is supplied to a process as its precursor for vapor deposition of a thin film.

Furthermore, argon ("Ar"), nitrogen ("$N_2$"), helium ("He"), or hydrogen ("$H_2$") gas or their mixture is used for carrying or diluting precursors to prevent compound degradation upon exposure to air throughout processing, and it is preferred to use thermal energy or plasma as an excitation source for processing gas for thin film vapor deposition, or to apply bias to a substrate. During the vapor deposition process based on the above organic compounds, its vapor pressure is set at 0.1-20 torr.

In the following the present invention is described in further detail using the following examples. These examples are presented merely to help understand the present invention, and the present invention is not limited to these examples.

EXAMPLE 1

Synthesis of Diethyl Amido Dihydroaluminum

A hexane suspension solution of the mixture containing 13.35 g (0.1 mol) of aluminum chloride and 11.4 g (0.3 mol) of lithium aluminum hydride was agitated at a low temperature, obtained by using acetone and dry ice under a nitrogen gas flow, while 29.25 g (0.4 mol) of colorless diethyl amine was added dropwise. A gitation was continued for 4 hours to complete the reaction even after the addition of the diethyl amine compound was finished.

To separate diethyl amido dihydroaluminum from the mixture after completion of the reaction, filtration was carried out under a nitrogen gas flow to obtain the first colorless filtrate, the filtered by-product on the filter was rinsed and filtered twice with a sufficient amount of hexane to obtain the second filtrate, and it was combined with the initial filtrate. All volatile substances were removed from the filtrate at room temperature (approximately 20° C.) under vacuum to obtain a white solid.

The dried white solid was dissolved at 42° C. and distilled under vacuum ($10^{-1}$ torr), while the solid was flocculated in a container cooled by dry ice. A colorless first distillate was purified at 45° C. by the same method to obtain 47 g of a white high-purity solid compound.

The chemical reaction used for preparing the above compound is listed in Chemical Equation 5 below, and the compound prepared and purified to high purity was analyzed by hydrogen and carbon nuclear magnetic resonance ("NM"R) and elemental analysis ("EA"). The analysis data and observed properties are listed in Table 1. The substance formed was confirmed to be diisopropyl amido dihydroaluminum.

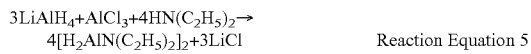

$3LiAlH_4+AlCl_3+4HN(C_2H_5)_2 \rightarrow$
$4[H_2AlN(C_2H_5)_2]_2+3LiCl$        Reaction Equation 5

EXAMPLE 2

Synthesis of Ethyl Methyl Amido Dihydroaluminum

A hexane suspension solution of aluminum chloride and lithium aluminum hydride prepared according to the same method as in Example 1 was agitated at a low temperature, obtained by using acetone and dry ice under a nitrogen gas flow, while 23.64 g (0.4 mol) of colorless ethyl methyl amine was added dropwise before filtration was carried out according to the same method as in Example 1 to obtain a filtrate, and a white solid was obtained after drying.

The dried white solid was dissolved at 52° C. and distilled under vacuum at $10^{-1}$ torr, and 52 g of the white solid compound was obtained in a container cooled with dry ice (−78° C.).

The chemical reaction used for preparing the above compound is listed in Reaction Equation 6 below, and the synthesized compound was subjected to hydrogen and carbon NMR and EA. The analysis data and observed properties are listed in Table 1. Its crystalline structure analysis (XRD: x-ray diffraction analysis) indicated a dimer, and it could be confirmed from Table 1 that the substance formed was ethyl methyl amido dihydroaluminum. As in FIG. 1, two nitrogen atoms were found to play the role of a bridge and form the two compounds as a dimer.

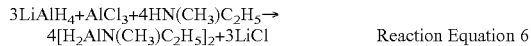

$3LiAlH_4+AlCl_3+4HN(CH_3)C_2H_5 \rightarrow$
$4[H_2AlN(CH_3)C_2H_5]_2+3LiCl$        Reaction Equation 6

EXAMPLE 3

Synthesis of Dipropyl Amido Dihydroaluminum

A hexane suspension solution of aluminum chloride and lithium aluminum hydride prepared according to the same method as in Example 1 was agitated at a low temperature, obtained by using acetone and dry ice under a nitrogen gas flow, while 40.47 g (0.4 mol) of dipropyl amine was added dropwise before filtration was carried out according to the same method as in Example 1 to obtain a filtrate, and a white solid was obtained after drying.

The dried white solid was dissolved at 65° C. and distilled under vacuum at $10^{-1}$ ton, and 55 g of the white solid compound was obtained in a container cooled with dry ice (−78° C.).

The chemical reaction used for preparing the above compound is listed in Reaction Equation 7 below, and the synthesized compound was subjected to hydrogen NMR analysis. The analysis data and observed properties are listed in Table 1. The substance formed was confirmed to be dipropyl amido dihydroaluminum.

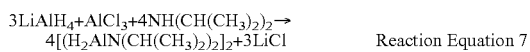

$3LiAlH_4+AlCl_3+4NH(CH(CH_3)_2)_2 \rightarrow$
$4[(H_2AlN(CH(CH_3)_2)_2]_2+3LiCl$        Reaction Equation 7

EXAMPLE 4

Synthesis of Diisopropyl Amido Dihydroaluminum

A hexane suspension solution of aluminum chloride and lithium aluminum hydride prepared according to the same method as in Example 1 was agitated at a low temperature, obtained by using acetone and dry ice under a nitrogen gas flow, while 40.47 g (0.4 mol) of diisopropyl amine was added dropwise before filtration was carried out according to the same method as in Example 1 to obtain a filtrate, and a white solid was obtained after drying.

The dry white solid described above was sublimed under vacuum at $10^{-1}$ torr while the temperature was raised to 130° C. and 48 g of a white high-purity solid compound was obtained in a container cooled with dry ice (−78° C.).

The above compound was subjected to hydrogen NMR analysis. The analysis data and observed properties are listed in Table 1. The substance formed was confirmed to be diisopropyl amido dihydroaluminum.

TABLE 1

| Compound from Example | Physical State (20° C.) | Color | Melting Point (° C.) | NMR Analysis (solvent, C6D6, unit ppm, δ) | | Element Analysis (%) (C, H, N, Al) | |
|---|---|---|---|---|---|---|---|
| | | | | (1H-NMR) | (13C-NMR) | Measured | Theoretical |
| 1 | solid | white | 42-45 | 0.90 (t, 6H, CH3), 2.80 (q 4H, CH2), 3.79 (br, 2H, AlH2) | 11.84 (CH3) 41.74 (CH3) | C: 47.23 H: 11.89 N: 13.22 Al: 26.66 | C: 47.51 H: 11.96 N: 13.85 Al: 26.68 |
| 2 | solid | white | 52-55 | 0.84 (dt, 3H, CH3), 2.24 (m, 3H, NCH2), 2.62 (q, 2H, NCH2), 4.12 (br, 2H, AlH2) | 12.56 (CH3) 370.5 (NCH3) 48.31 (NCH3) | C: 41.07 H: 11.63 N: 16.01 Al: 29.88 | C: 41.87 H: 11.57 N: 16.08 Al: 30.98 |
| 3 | solid | white | 58-60 | 0.68 (t, 6H, CH3), 1.38 (m, 4H, CH2), 2.83 (t, 4H, NCH2), 4.26 (br, 2H, AlH2) | | | |
| 4 | solid | white | 112-115 | 1.27, 1.29 (s, 12H, CH3), 3.55 (m, 2H, NCH), 3.79 (m, 2H, AlH2) | | | |

EXAMPLE 5

Preparation of 1-methyl Pyrrolidine Solution of Ethyl Methyl Amido Dihydroaluminum A solute compound of ethyl methyl amido dihydro aluminum obtained according to the same method as in Example 2 above was added to a purified 1-methyl pyrrolidine solvent to obtain a colorless solution.

The following describes the aluminum thin film vapor deposition tests performed with the diethyl amido dihydroaluminum prepared according to Example 1, ethyl methyl amido dihydroaluminum prepared according to Example 2, and 1-methyl pyrrolidine solution of ethyl methyl amido dihydroaluminum prepared according to Example 5.

Experiment 1

A diethyl amido dihydroaluminum compound prepared according to the method in Example 1, an ethyl methyl amido dihydroaluminum compound prepared according to the method in Example 2, and a dipropyl amido dihydroaluminum compound prepared according to the method in Example 3 were individually placed in stainless steel bubbler containers, each in the amount of 20 g and heated to 55° C. while argon (Ar) gas was used as a carrier gas by bubbling through the precursor compounds at a flow rate of 200 sccm in vacuum of $5 \times 10^{-2}$ torr created by a vacuum pump.

The precursor compounds that had been vaporized by bubbling were diluted with the carrier gas and passed through a stainless steel tube heated to 70° C. into a reactor in which a substrate was placed for thin film vapor deposition. The walls of the reactor were heated to 70° C. to prevent condensation of the precursor compounds introduced, and high-purity aluminum thin films were deposited on the silicon substrate of 1×2 cm wherein 900 Å thick layer of TiN had been deposited on 2000 Å thick $SiO_2$ at a temperature of 170° C.

Following the vapor deposition, the aluminum thin film was measured for the impurity content with Auger electron spectroscopy, and it was confirmed that the aluminum thin film formed by vapor deposition was of high purity. The sheet resistivity was measured with a four-point probe. The conditions of the vapor deposition experiments and analysis results are listed in Table 2.

Experiment 2

With the precursor compound solution synthesized according to the method in Example 5 above, the same silicon substrate was used as in Experiment 1 above to apply chemical vapor deposition for depositing aluminum thin films. The substrate temperature was 170° C., and one end of the reactor vessel, a glass tube having 5 cm inner diameter and 30 cm in length was closed, the other end was connected to a vacuum pump ($10^{-2}$ ton). The precursor solution was filled into a 5 ml glass container which was placed at the closed end of the reactor. Several thin silicon wafers were placed at the center of the glass tube. High-purity aluminum thin films were formed by vapor deposition while the precursor solution and substrate were heated with separate heating coils to 60° C. and 170° C., respectively, and a vacuum pump was used to evacuate the reactor at a pressure of $10^{-2}$ torr.

The deposited thin film was confirmed to be a high-purity aluminum thin film using AES and a 4-point probe. The results are listed in Table 3. It was also confirmed that the solution of the present invention was suitable for liquid precursor delivery systems such as a direct liquid injector or a liquid delivery system.

TABLE 3

| | vapor deposition condition | | thin film | |
|---|---|---|---|---|
| Precursor | evaporation temp | 60° C. | resistivity | 2.5-3.2 μΩ · cm |
| | substrate temp | 170° C. | impurity | none (based on AES) |
| | reactor pressure | $10^{-1}$ torr | adhesion | good on TiN |

As demonstrated in Experiment 1 and Experiment 2, the aluminum vapor deposition process based on the compounds of the present invention can be performed when the temperature of its substrate is at relatively low vapor deposition temperatures of 120° C.-250° C. It can also be confirmed that clean aluminum thin films of high purity are cleanly formed on a silicon substrate by vapor deposition, and vapor deposition may be carried out with a direct liquid injector or a liquid delivery system.

TABLE 2

| Precursor from Example | Vapor Deposition Condition | | Thin Film | |
|---|---|---|---|---|
| 1 | carrier gas | argon | resistance | 2.8-3.5 μΩ · cm |
| | bubbler temperature | 55° C. | impurities | none (based on AES) |
| | reactor/delivery tube temperature | 70° C. | adhesion reflectivity | good on TiN |
| | substrate temperature | 170° C. | | good |
| | flow rate | 200 sccm | | |
| | reactor pressure | $5 \times 10^{-2}$ torr | | |
| 2 | carrier gas | argon | resistance | 2.8-3.5 μΩ · cm |
| | bubbler temperature | 55° C. | impurities | none (based on AES) |
| | reactor/delivery tube temperature | 70° C. | adhesion reflectivity | good on TiN |
| | substrate temperature | 170° C. | | good |
| | flow rate | 200 sccm | | |
| | reactor pressure | $5 \times 10^{-2}$ torr | | |
| 3 | carrier gas | nitrogen | resistance | 2.8-3.5 μΩ · cm |
| | bubbler temperature | 55° C. | impurities | none (based on AES) |
| | reactor/delivery tube temperature | 70° C. | adhesion reflectivity | good on TiN |
| | substrate temperature | 170° C. | | good |
| | flow rate | 200 sccm | | |
| | reactor pressure | $5 \times 10^{-2}$ torr | | |

As described above, the dialkyl amido dihydroaluminum compounds of the present invention useful for thin film vapor deposition are thermally stable at room temperature and when heated so that the precursors do not decompose in a storage container and particles are not formed. Carbon impurities are not generated because the temperature of a substrate may be at relatively low vapor deposition temperatures of 120° C.-250° C. The present method allows not only to form clean aluminum thin films of high purity by vapor deposition on a silicon substrate but also to effectively carry out vapor deposition using a direct liquid injector or a liquid delivery system.

What is claimed is:

1. A method for forming an aluminum film by vapor deposition comprising:
   (a) heating a substrate to 120° C. to 250° C. in a vapor deposition reactor; and
   (b) adding to the vapor deposition reactor a compound of the formula $[H_2AlNR1R2]_n$, wherein R1 and R2 are the same or different alkyl groups with 1 to 3 carbons, and n is an integer of 2 or 3, in a vapor phase, whereby the aluminum film is generated and deposited on the heated substrate, and wherein carbon impurities are not generated.

2. The method of claim 1 wherein the compound is dimethyl amido dihydroaluminum.

3. The method of claim 1 wherein the vapor deposition reactor is chosen from a CVD reactor and an ALD reactor.

4. A method for forming an aluminum film by vapor deposition comprising:
   (a) heating a substrate to 120° C. to 250° C. in a vapor deposition reactor;
   (b) heating in the vapor deposition reactor a precursor solution comprising a compound of the formula $[H_2AlNR1R2]_n$, wherein R1 and R2 are the same or different alkyl groups with 1 to 3 carbons, and n is an integer of 2 or 3, whereby the aluminum film is generated and deposited on the heated substrate; and
   (c) evacuating the reactor with a vacuum pump, wherein the precursor solution is thermally stable at room temperature, and wherein carbon impurities are not generated as a result of heating the precursor solution.

* * * * *